United States Patent
Seo et al.

(10) Patent No.: US 7,236,506 B2
(45) Date of Patent: Jun. 26, 2007

(54) METHOD AND APPARATUS FOR COMPENSATING FOR TEMPERATURE CHARACTERISTICS OF LASER DIODE IN OPTICAL COMMUNICATION SYSTEM

(75) Inventors: Ja-Won Seo, Suwon-si (KR); Joong-Hee Lee, Seongnam-si (KR); Joo-Chul Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/285,845

(22) Filed: Nov. 23, 2005

(65) Prior Publication Data

US 2006/0114952 A1 Jun. 1, 2006

(30) Foreign Application Priority Data

Nov. 30, 2004 (KR) .................... 10-2004-0099563

(51) Int. Cl.
*H01S 3/10* (2006.01)
*H01S 3/00* (2006.01)
*H01S 3/04* (2006.01)

(52) U.S. Cl. ............................ 372/26; 372/33; 372/34
(58) Field of Classification Search .................. 372/26, 372/33
See application file for complete search history.

(56) References Cited

U.S. PATENT DOCUMENTS

| 5,844,928 | A  | * | 12/1998 | Shastri et al. ............ 372/38.02 |
| 5,907,569 | A  | * | 5/1999  | Glance et al. ......... 372/29.021 |
| 6,414,974 | B1 | * | 7/2002  | Russell et al. ........... 372/38.02 |
| 6,907,055 | B2 | * | 6/2005  | Morley et al. ............. 372/38.1 |
| 2003/0090289 | A1 | * | 5/2003 | Morley et al. .............. 324/767 |

* cited by examiner

*Primary Examiner*—Armando Rodriguez
(74) *Attorney, Agent, or Firm*—Cha & Reiter, LLC

(57) ABSTRACT

A method and apparatus for compensating for temperature characteristics of a laser diode are disclosed. The laser diode may be used in a transmitter unit of a transceiver for optical signal transmission. The transceiver includes the laser diode and a monitor photodiode. In such a method, a modulation current is derived from an input voltage and arbitrary variables. Variations of overall modulation resistance values corresponding to an operation temperature range are evaluated by a relation between the modulation current and the overall modulation resistance, and the overall modulation resistance values are determined according to the variations. Also, variations of overall bias resistance values corresponding to the temperature range are evaluated by a current Impd of the photodiode, which is derived at specific optical power arbitrarily chosen in the temperature range. The overall bias resistance values are determined according to the variations.

10 Claims, 9 Drawing Sheets

METHOD AND APPARATUS FOR COMPENSATING FOR TEMPERATURE CHARACTERISTICS OF LASER DIODE IN OPTICAL COMMUNICATION SYSTEM

CLAIM OF PRIORITY

This application claims priority to applications entitled "Method and Apparatus for Compensating for Temperature Characteristics of Laser Diode in Optical Communication System," filed in the Korean Intellectual Property Office on Nov. 30, 2004 and assigned Serial No. 2004-99563, the contents of which are hereby incorporated by reference.

BACKGROUND OF THE INVENTION

1. Field of the Invention

The present invention relates to a method and an apparatus for driving a laser diode, and more particularly to a method and an apparatus to compensate for temperature characteristics of a laser diode in an optical communication system.

2. Description of the Related Art

Efforts have been made to use light for communication ever since the first ruby laser was developed by Maiman. For example, Corning Glass Inc., launched development of an optical fiber having a transmission loss of 20 dB/km and succeeded in commercialization thereof in 1974.

The optical communication is a communication technology that transmits light through an optical fiber made of glass or plastic. In such optical communication schemes, data transmission is done by converting information to be transmitted from an electric signal into an optical signal, delivering the converted optical signal to a destination, and converting the optical signal into the original electric signal on a receiving side. A typical example of such an optical communication system is an optical transmission system using an optical fiber transmission path as a transmission media, a semiconductor laser or a light emitting diode as a light source, and an optical detector as a light receiver.

Hereinafter, a transceiver for optical signal transmission, which transmits optical signals in such an optical communication system, will be described in detail with reference to the accompanying drawings.

FIG. 1 illustrates a structure of a transceiver for optical signal transmission in a common optical communication system.

Referring to FIG. 1, the transceiver is divided into a receiver unit 110 for photoelectrically converting an optical signal into an electric signal, and a transmitter unit 120 for photoelectrically converting an electric signal into an optical signal.

The receiver unit 110 includes a photo diode 111 for receiving the optical signal, a preamplifier 112 for converting a current signal generated by the photo diode 111 into a voltage signal, and a limiting amplifier (limiter) 113 for limiting an output of the preamplifier 112 to a desired voltage level.

The transmitter unit 120 includes a laser driving circuit (hereinafter referred to as "LD driver") 121 for supplying a current to a laser, a laser diode 122 for generating an optical signal proportionally to a current generated by the LD driver 121, an automatic power control circuit (hereinafter referred to as "APC circuit") 123 for compensating for a power change of the laser diode 122, and an automatic modulation control circuit (hereinafter referred to as "AMC circuit") 124 for compensating for a modulation current of the laser diode 122.

In general, the LD driver 121 can vary a bias current and a modulation current of a laser with a change of an output optical signal.

FIG. 2 is a circuit diagram illustrating an LD driver which varies a bias current and a modulation current with a change of an output optical signal in a transmitter unit of a common transceiver for optical signal transmission.

Referring to FIG. 2, a laser diode 11 and a monitor photodiode 21 are connected to an input stage of the LD driver 121, and a current/voltage converter 30 is connected to the monitor photodiode 21. A peak error detector 40 and a bottom error detector 50 are connected in parallel to the current/voltage converter 30, and a voltage generator 60 is connected between the peak error detector 40 and the bottom error detector 50. Also, a modulation current driver section 80 and a bias current driver 90 are connected to the laser diode 11.

The peak error detector 40 includes a peak holding circuit 41 and an Op Amp 42, and the bottom error detector 50 includes a bottom holding circuit 51 and an Op Amp 53.

The modulation current driver section 80 includes FETs 81, 82, to which an input voltage Vcc and an output of the laser diode 10 are inputted, respectively, and a variable current source 83.

The bias current driver section 90 includes a variable current source 91.

The LD driver operates as follows.

The laser diode 10 is driven by the modulation current driver section 80 and the bias current driver section 90 to emit a part of an optical signal into an optical fiber. The photodiode 20 also receives a part of the emitted signal. The photodiode 20 outputs a current Ipd proportional to the received light. The output current is converted into a voltage Vo by the current/voltage converter 30. The converted voltage signal is input to the peak error detector 40 and passes through the peak holding circuit 41 to output a voltage Vop as shown in FIG. 3. The peak error detector 40 outputs an inverted signal of Vop by the Op Amp 42. The converted voltage signal is input to the bottom error detector 50 and passes through the bottom holding circuit 51 to output a voltage Vob as shown in FIG. 3. The bottom error detector 50 outputs an inverted signal of Vob by the Op Amp 52.

When the intensity of the optical signal generated by the laser diode 11 varies, for example, when the intensity of the optical signal is lowered with the passage of time as shown in FIG. 3, the voltage Vo also varies. The output of the peak holding circuit 41 varies like Vop with a peak voltage of the Vo signal, and the output of the bottom holding circuit 51 varies like Vob with a bottom voltage of the Vo signal. Thus, if both the output signals are input to inverting input stages of the inverter Op Amps 42, 52, outputs of the Op Amps 42, 52 become higher than those in an equilibrium state because both the output signals has been already lowered. As a result of this, currents of the variable current source 83 of the modulation current driver section 80 and the variable current source 91 of the bias current driver section 90 increase. Consequently, since the currents of the two variable current sources, the lowered optical power can be raised. Even in the opposite case, the LD driver 120 similarly operates according to such a principle.

However, the LD driver cannot compensate for temperature tracking errors. The monitor photodiode used for the laser module generally undergoes a change in its output current with respect to temperature around the laser module. If a current of the photodiode is measured with respect to a specific magnitude of laser power while changing the temperature around the laser module, the measured current varies from temperature to temperature. Thus, if temperature-by-temperature tracking errors of the laser module occur when laser power is arbitrary, compensating circuits of the prior art cannot compensate well for the optical power.

Also, the LD driver is difficult to construct the peak and bottom holding circuits, and all of the two holding circuits require a reset circuit. When peak and bottom levels of the laser gradually varies in an increasing direction, voltage tracking is possible because a holding capacitor current inside of the holding circuit is charged, but when the increased peak and bottom levels gradually vary in a decreasing direction, tracking of the decreased peak and bottom levels are impossible because the charged current cannot be discharged by the laser diode.

SUMMARY OF THE INVENTION

One aspect of the present invention relates to a method and an apparatus for compensating for temperature characteristics of a laser dido in a transmitter unit of a transceiver for optical signal transmission. Another aspect of the present invention relates to a method and an apparatus that can simultaneously compensate for optical power and tracking errors with respect to a temperature change.

One embodiment of the present invention relates to a method for compensating for temperature characteristics of a laser diode used in a transmitter unit of a transceiver for optical signal transmission in an optical communication system. The transceiver includes the laser diode and a monitor photodiode. The method includes the steps of deriving a modulation current from an input voltage and arbitrary variables, evaluating variations of overall modulation resistance values corresponding to an operation temperature range by means of a relation between the modulation current and the overall modulation resistance, and determining the overall modulation resistance values according to the variations of the modulation resistance values, thereby compensating for the modulation current; and evaluating variations of overall bias resistance values corresponding to the operation temperature range by means of a current Impd of the photodiode, which is derived at specific optical power arbitrarily chosen in the operation temperature range, and determining the overall bias resistance values according to the variations of the bias resistance values, thereby compensating for a bias current.

Another embodiment of the present invention is directed to an apparatus for compensating for temperature characteristics of a laser diode used in a transmitter unit of a transceiver for optical signal transmission in an optical communication system. The transceiver includes the laser diode and a monitor photodiode. The apparatus includes a modulation current compensator module for deriving a modulation current from an input voltage and arbitrary variables, evaluating variations of overall modulation resistance values corresponding to an operation temperature range by means of a relation between the modulation current and the overall modulation resistance, and determining the overall modulation resistance values according to the variations of the modulation resistance values, thereby compensating for the modulation current; and a bias current compensator module for evaluating variations of overall bias resistance values corresponding to the operation temperature range by means of a current Impd of the photodiode, which is derived at specific optical power arbitrarily chosen in the operation temperature range, and determining the overall bias resistance values according to the variations of the bias resistance values, thereby compensating for a bias current.

BRIEF DESCRIPTION OF THE DRAWINGS

The above and other aspects, features and embodiments of the present invention will be more apparent from the following detailed description taken in conjunction with the accompanying drawings, in which.

DETAILED DESCRIPTION

Figure 1:
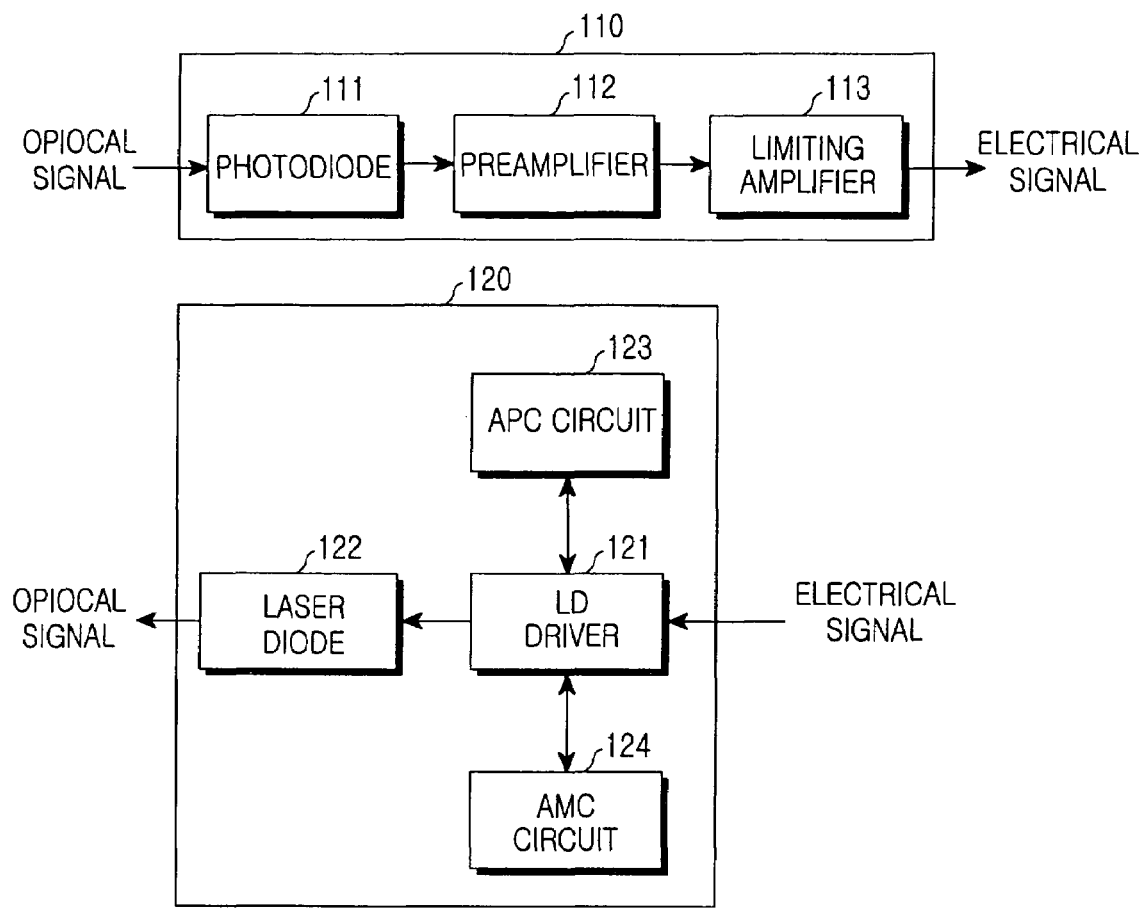
FIG. 1 is a view illustrating a structure of a transceiver for optical signal transmission in a common optical communication system.
Figure 2:
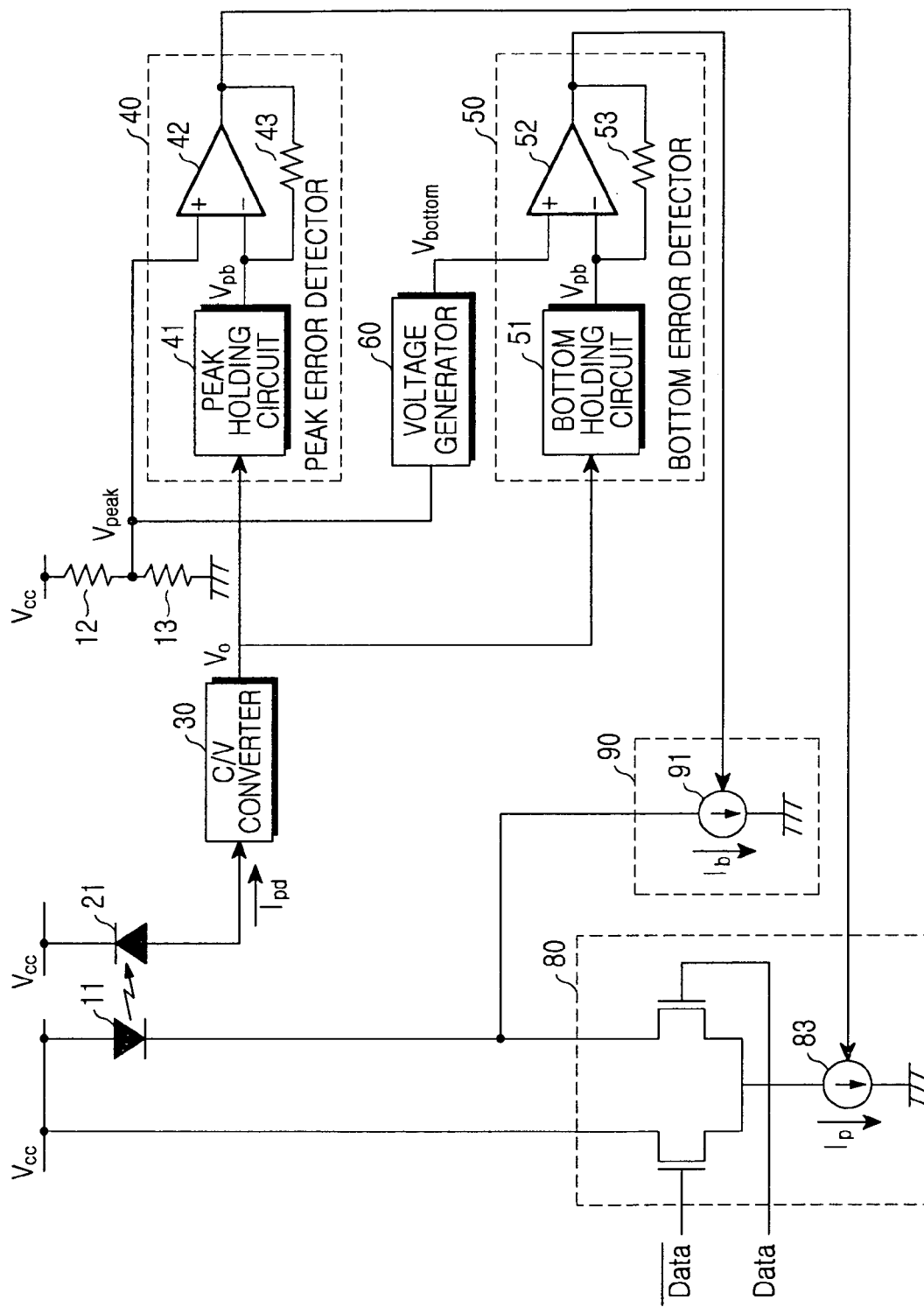
FIG. 2 is a view illustrating an LD driver in a common optical communication system.
Figure 3:
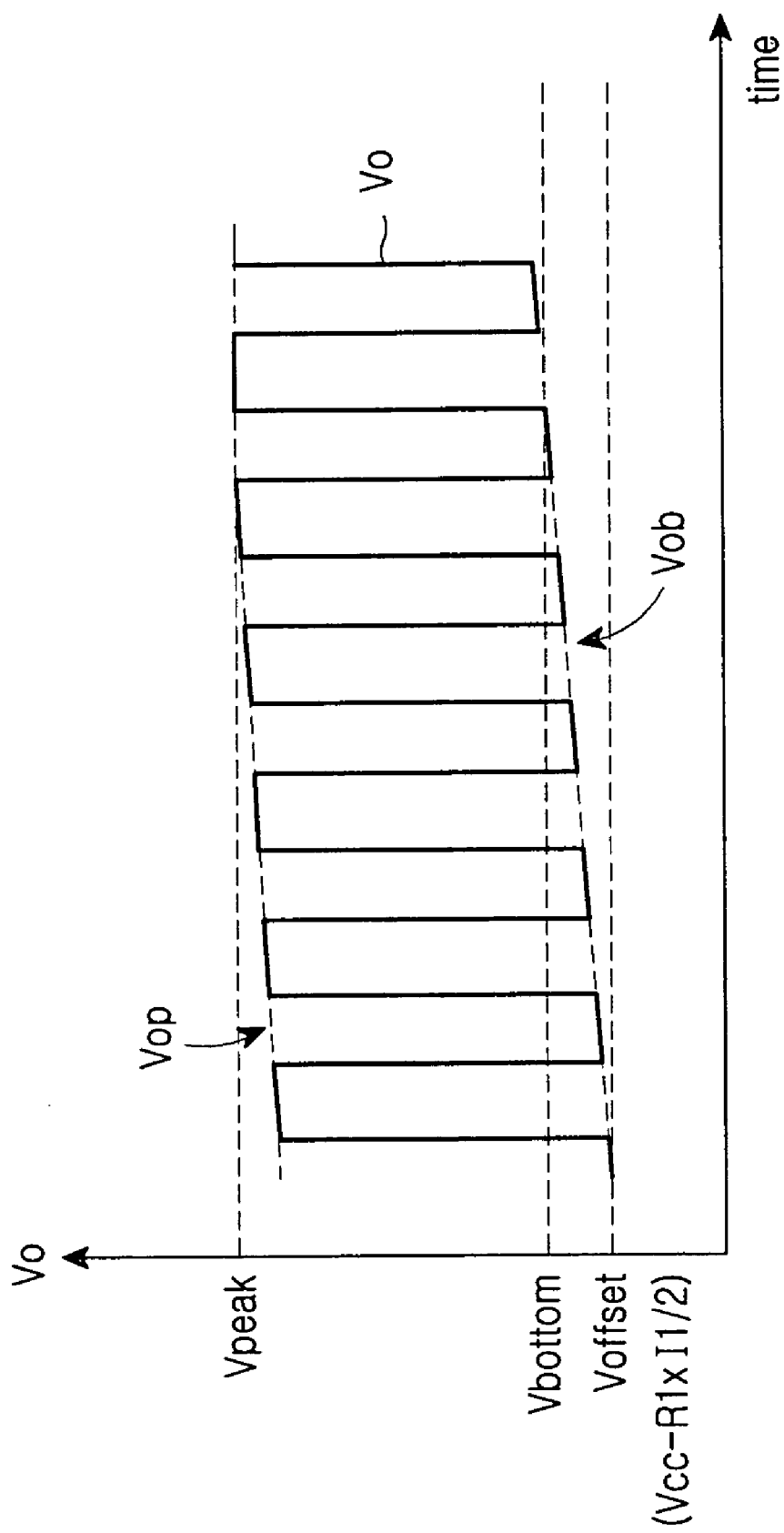
FIG. 3 is a view for explaining an operation of an LD driver in a common optical communication system.

Hereinafter, embodiments of the present invention will be described with reference to the accompanying drawings. It should be noted that the similar components are designated by similar reference numerals although they are illustrated in different drawings. For the purposes of clarity and simplicity, a detailed description of known functions and configurations incorporated herein will be omitted as it may obscure the subject matter of the present invention.

It is noted that embodiments of the present invention may be applied to the LD driver 121 (shown in FIG. 1) of the transmitter unit 120 for converting an electric signal into an optical signal to emit the optical signal in the transceiver for optical signal transmission. Hereinafter, a description will be given for a method and an apparatus for compensating for temperature-by-temperature tracking errors due to a current change of the monitor photodiode used in the LD driver 121 in connection with embodiments of the present invention. Also, in the following description of the embodiments of the present invention, reference numerals used in an LD driver in accordance with the embodiments of the present invention will be expressed differently from those used in an LD driver of the prior art for the convenience of explanation.

Figure 4A:
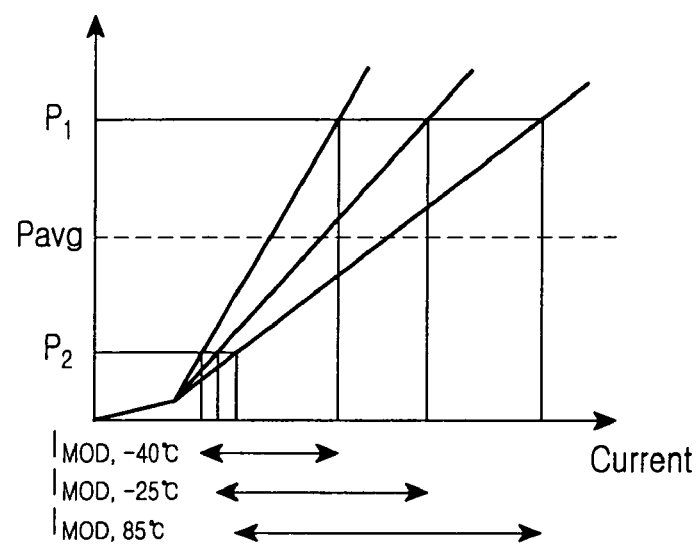
FIGS. 4a to 4c are graphs illustrating characteristics of an overall modulation resistance value and an overall bias resistance of an LD driver in an optical communication system in accordance with an embodiment of the present invention.

Major optical signal characteristics of the transmitter unit of the transceiver for optical signal transmission are determined by a constant magnitude of optical power and a constant extinction ratio. However, according to general temperature characteristics of a laser, Pavg becomes smaller with an increase in ambient temperature as shown in FIG. 4a, and such temperature characteristics are different in every laser module. Consequently, it is difficult to compensate the respective laser modules for the temperature characteristics. Here, Pavg is an average of P1 and P2.

Therefore, a detailed description will be given below for an LD driver and a method for automatically adjusting bias and modulation currents of the laser according to ambient temperature.

Figure 4B:
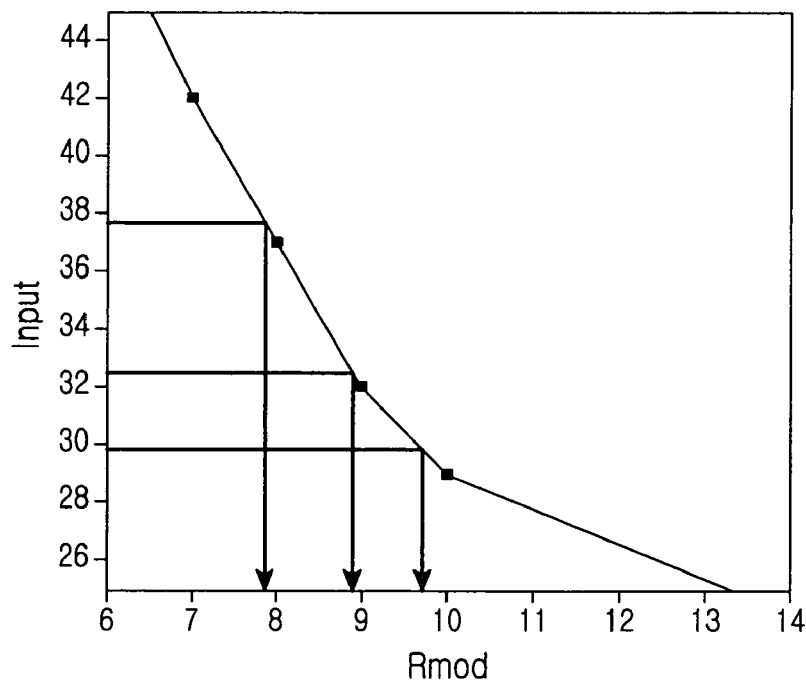
Figure 4C:
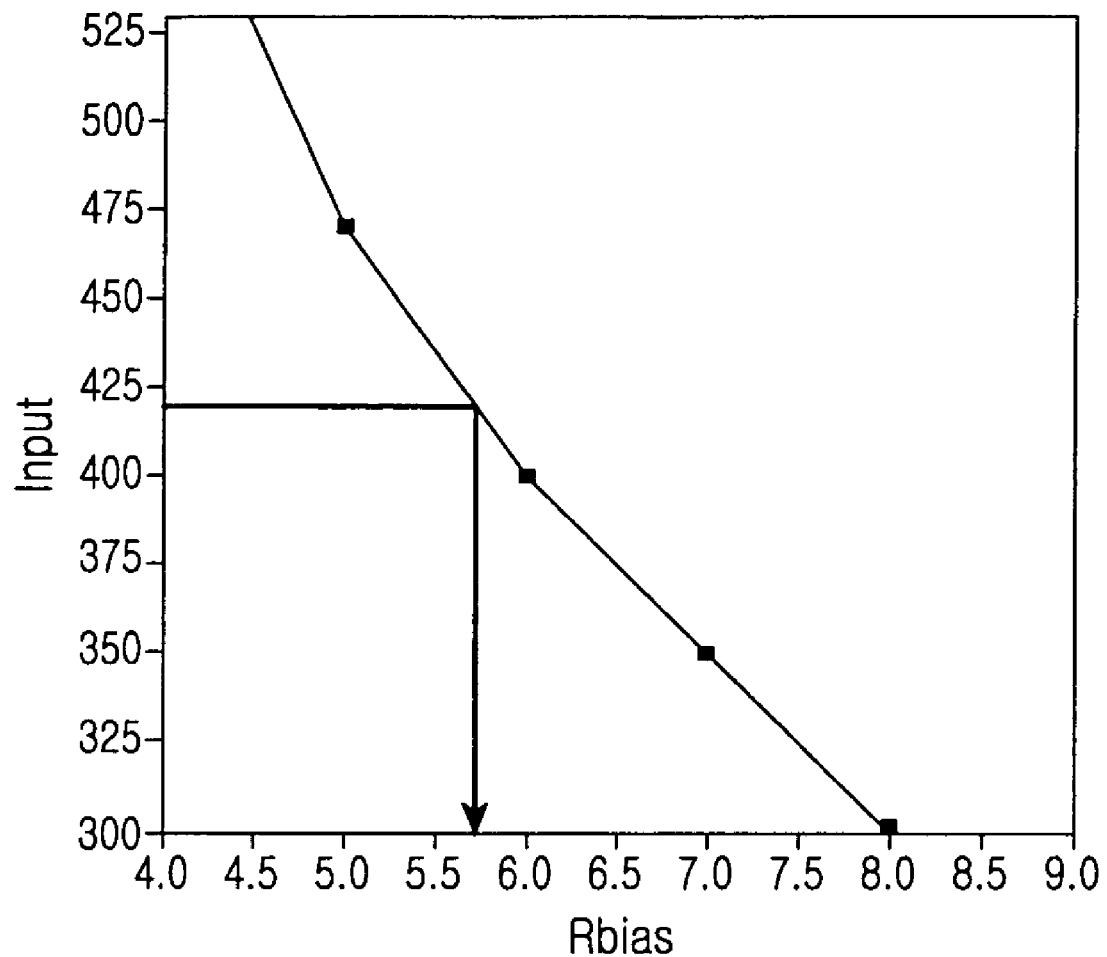

FIGS. 4b and 4c illustrate characteristics of an overall modulation resistance value and an overall bias resistance of an LD driver in an optical communication system in accordance with an embodiment of the present invention. Here, FIG. 4b is a characteristic curve of Rmod vs. Imod in the LD driver, and FIG. 4c is a characteristic curve of Rbias vs. Impd in the LD driver.

It is noted that a relation between the magnitude of optical power Pp-p (peak-to-peak power) and the extinction ratio η can be expressed by the following Equations (1) and (2):

$$I_{MOD} = \frac{P_{p-p}}{\eta[W/A]} \quad (1)$$
$$= \frac{2.06m\Pi}{\eta[W/A]}$$

Using Pp-p in Equation (1), a modulation current can be derived as follows:

$$P_{p-p} = P_1 - P_0 \quad (2)$$
$$= \frac{2 \cdot P_{avg} \cdot ER}{ER+1} - \frac{2 \cdot P_{avg}}{ER+1}$$
$$= \frac{2 \cdot 1.26m\Pi \cdot 10}{10+1} - \frac{2 \cdot 1.26m\Pi}{10+1}$$
$$= 2.06m\Pi$$

Now, an LD driver according to embodiments of the present invention will be described with reference to FIG. 5.

Figure 5:
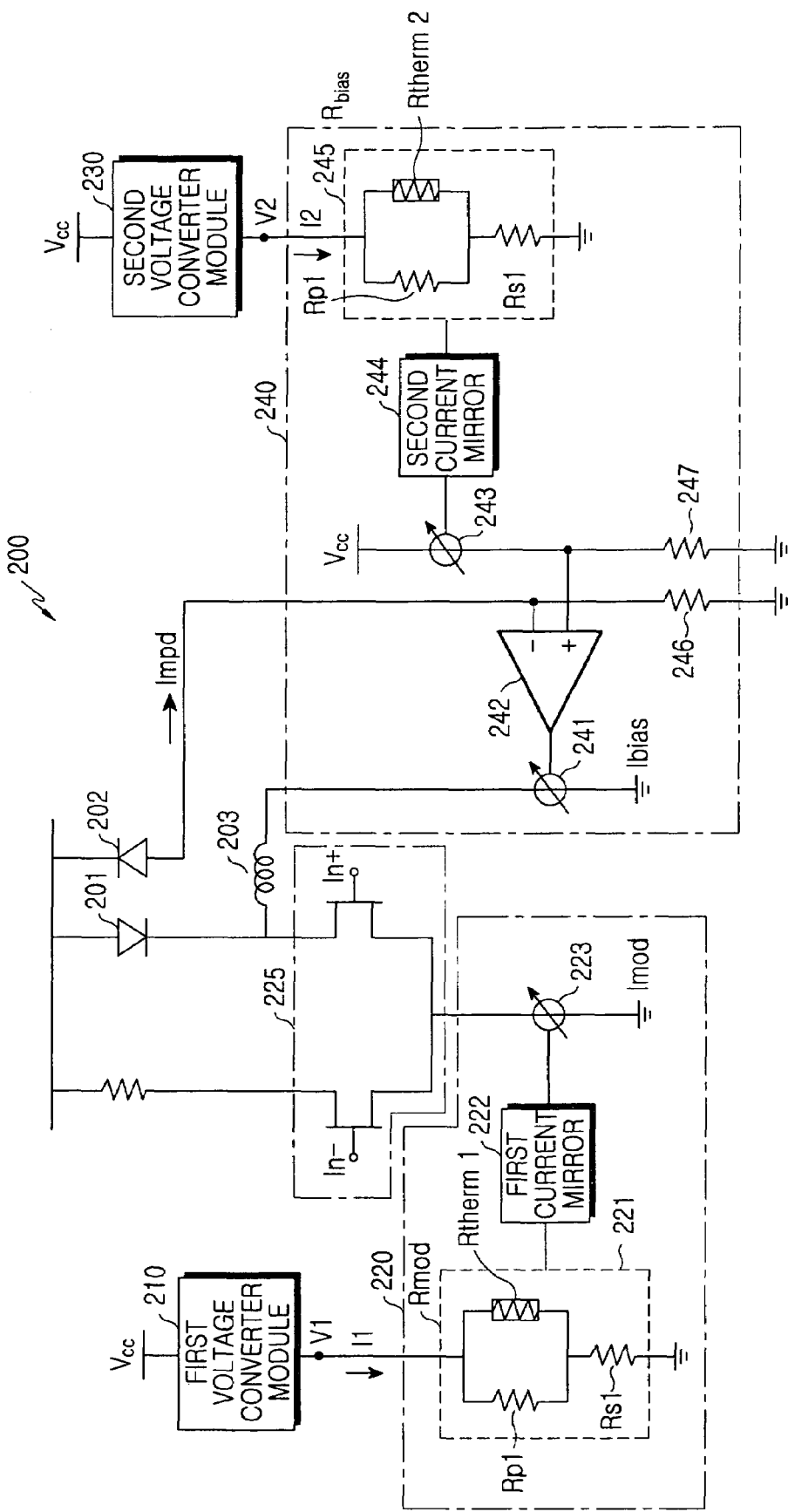
FIG. 5 is a view illustrating an LD driver in an optical communication system in accordance with an embodiment of the present invention.

Referring to FIG. 5, a LD driver 200 includes a laser diode 201, a monitor photodiode 202, a first voltage converter module 210, a modulation current compensator module 220, a second voltage converter module 230 and a bias current compensator module 240.

The modulation current compensator module 220 includes a modulation current setting section 221, a first current mirror 222 and a modulation current driver section 223.

The bias current compensator module 240 includes a variable bias current source 241, a comparator 242, a variable current source 243, a second current mirror 244, a bias current setting section 245 and resistors 246, 247.

The first voltage converter module 210 is connected to an input stage to be supplied with a voltage Vcc, and is connected in serial to the modulation current setting section 221 and the first current mirror 222 of the modulation current compensator module 220.

The laser diode 201 is connected to a differential amplifier 225, the input stage and the variable bias current source 241 of the bias current compensator module 240. The differential amplifier 225 is connected to a variable modulation current source 203. The monitor photodiode 202 is connected to the comparator 242 which is connected to the variable bias current source 241 and the resistors 246, 247.

The second voltage converter module 230 is connected to the input stage to be supplied with the voltage Vcc, and is connected in serial to the bias current setting section 245 and the second current mirror 244 of the bias current compensator module 240. The variable current source 243 is connected to the input stage between the second current mirror 244 and the resistor 247 connected to a plus terminal of the comparator 242.

Each of the modulation current setting section 221 and the bias current setting section 245 has a structure in which three resistors are connected to each other. In the connection structure of these three resistors, a thermistor Rtherm1 or Rtherm2, a resistance value of which varies with temperature, is connected in parallel to a resistor Rp1 or Rp2, and is connected in serial to a resistor Rs1 or Rs2. An overall resistance value consisting of resistance values of the three resistors, that is, resistance values of the modulation current setting section 221 and the bias current setting section 245 are referred to as "Rmod" and "Rbias", respectively.

FIGS. 6a to 6d illustrate changes in the thermistor resistance as a function of temperature in accordance with an embodiment of the present invention.

Figure 6A:
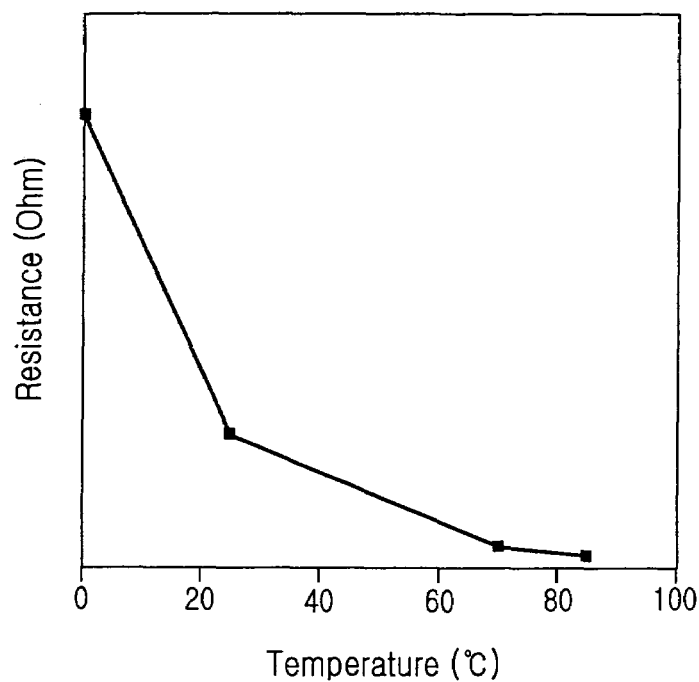
FIGS. 6a to 6d are graphs illustrating changes of thermistor resistance as a function of temperature in accordance with an embodiment of the present invention.
Figure 6B:
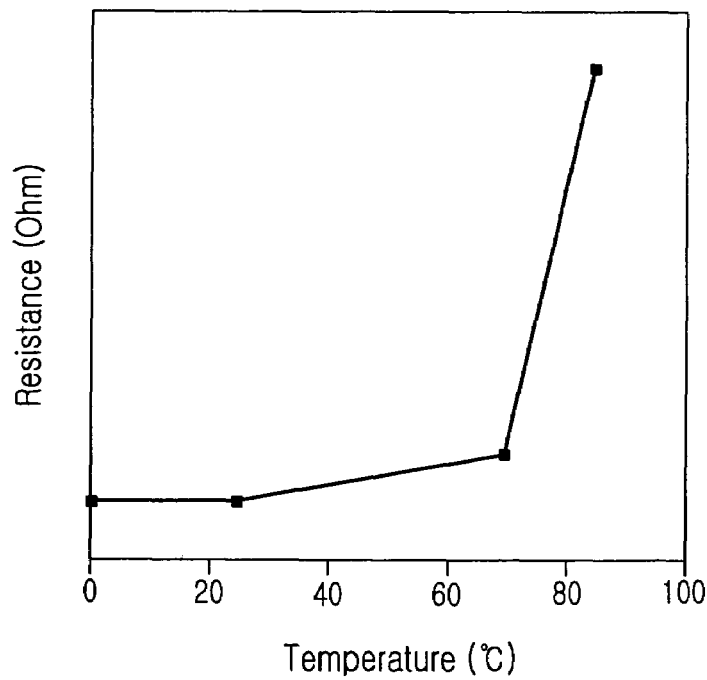
Figure 6C:
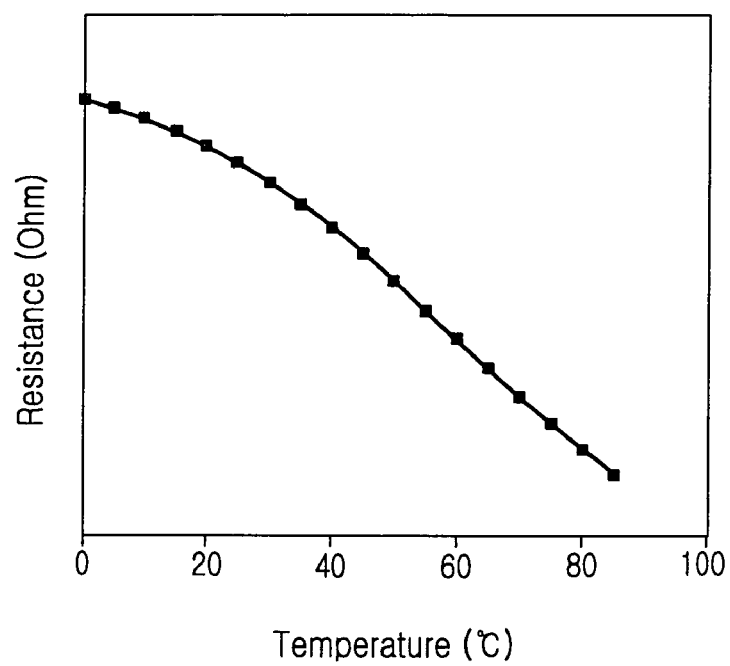
Figure 6D:
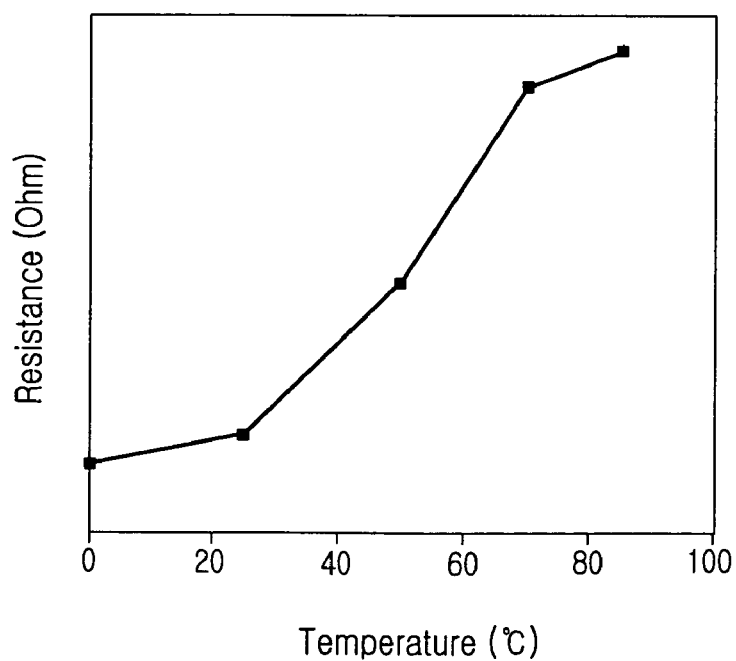

In other words, FIG. 6a corresponds to an example of a thermistor exhibiting a characteristic in which its resistance decreases with an increase in the temperature. FIG. 6c is a graph showing the resistance change according to the temperature when serial and parallel resistors are connected to the thermistor having the characteristic of FIG. 6a as in the modulation current setting section 221 or the bias current setting section 245. Similarly, FIG. 6b corresponds to an example of a thermistor exhibiting a characteristic in which its resistance increases with an increase in the temperature. FIG. 6d is a graph showing the resistance change according to the temperature when serial and parallel resistors are connected to the thermistor having the characteristic of FIG. 6b as in the modulation current setting section 221 or the bias current setting section 245. The parallel resistor functions to determine a slope of the resistance change curve according to the temperature.

Hereinafter, a description will be given for a method for compensating for temperature characteristics of the so-constructed LD driver.

If a current I1, which is generated based on the voltage Vcc input to the first voltage converter module 210 and the overall resistance value of the modulation current setting section 221, is input to the first current mirror 222, the first current mirror 222 increases the current I1 by an arbitrary integer times, and the increased current is input to the variable modulation current source 203. In this way, the variable modulation current source 203 determines a modulation current. If a current increase ratio of the first current mirror 222 is n, a current of the variable modulation current source 203 is n×I1, and the current of the variable modulation current source 203 flow into the laser diode 201 when a high voltage of a modulation signal is applied to In+, one of two inputs of the differential amplifier 225.

A bias current is adjusted by the comparator 242 where a voltage, which is generated by inputting a current of the monitor photodiode 202 for monitoring optical power of the laser diode 201 to the resistor 246, is applied to a minus (−) terminal of two input terminals of the comparator 242. In addition, a voltage, which is generated by inputting a current of the variable bias current source 241 (i.e., n×I2) to the resistor 247, is input to the plus (+) terminal of the comparator 242. The current n×I2 of the variable bias current source 241 is generated by inputting a current I2, which is generated by a combination of the resistors of the bias current setting section 245, to the second current mirror 244 to increase it by an arbitrary integer interval. The variable current source 243 outputs a current while changing the current until the two voltages input to the comparator 242 are balanced. In this way, the bias current of the laser diode 201 can determined.

Hereinafter, a description will be given for a method for determining resistance values to compensate for temperature-dependent characteristics of the laser diode. This enables the optical power and the extinction ratio to be maintained in a constant manner.

The LD driver is designed to allow the bias current and the modulation current, on which the characteristics of the graphs in FIGS. 4b and 4c are reflected, to flow into the laser diode by the resistance values Rmod and Rbias. Thus, a user predicts necessary Rmod and Rbias by calculating Imod and Ibias required for obtaining constant optical power irrespective of a temperature change at each temperature. Accordingly, the LD driver is designed so that the necessary resistance values can vary with temperature by using the thermistor in Rmod and Rbias.

Figure 7:
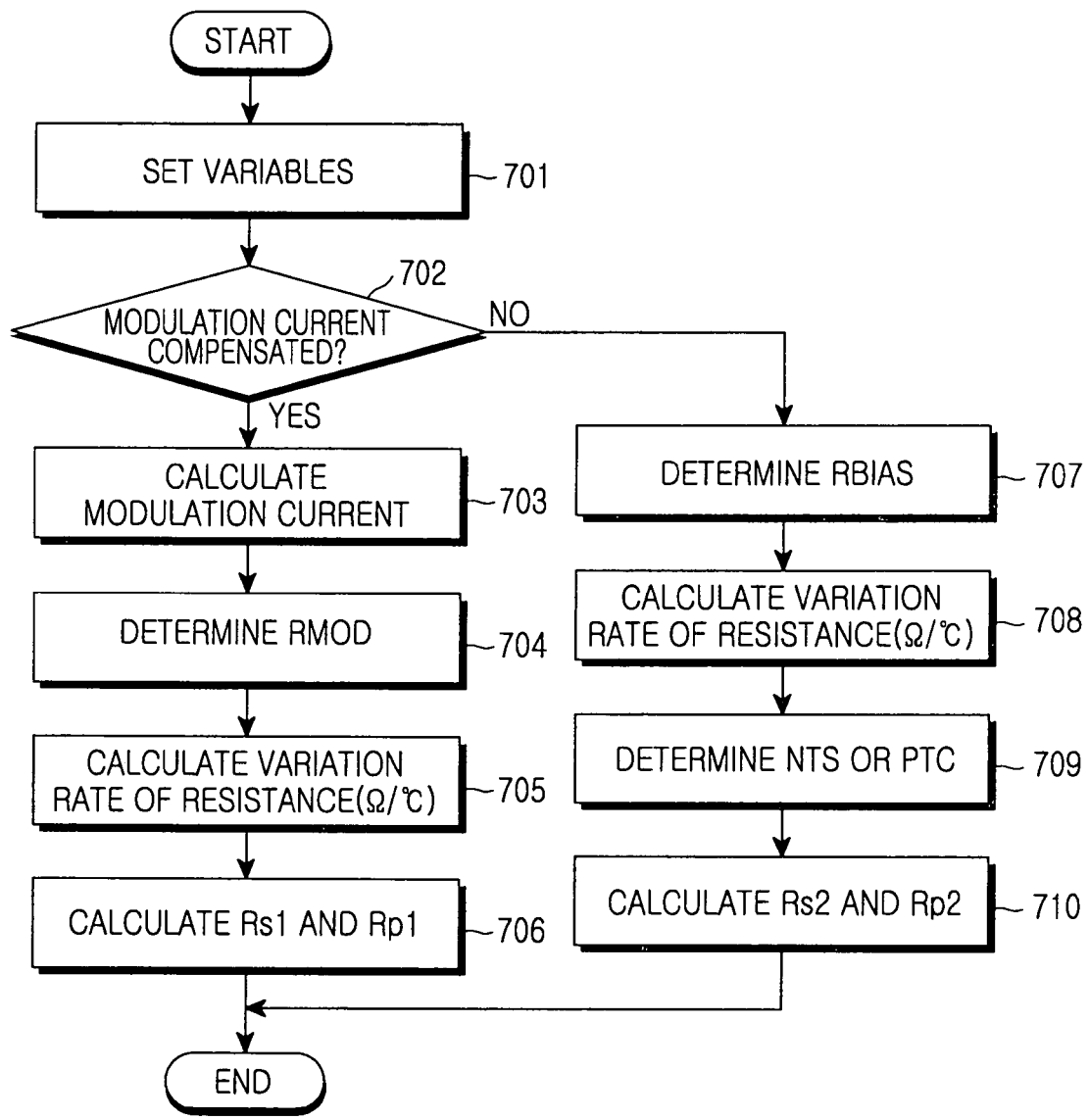
FIG. 7 is a view illustrating procedures of determining resistance values of an LD driver so as to compensate for characteristics of a laser diode to maintain constant optical power and a constant extinction ratio in accordance with an embodiment of the present invention.

FIG. 7 illustrates procedures of determining resistance values of an LD driver to compensate for characteristics of a laser diode to maintain constant optical power and a constant extinction. Determining the resistance values of the LD driver may be performed in a region which takes charge of controls and operations of the LD driver in the transceiver for optical signal transmission. Such a region is not shown in the accompanying drawings, and the following procedures will be generally described on the supposition that the transmitter unit of the transceiver for optical signal transmission determines the resistance values of the LD driver.

As an example, in step 701, the transmitter unit is supplied with data about slope efficiencies, threshold currents Ith and monitor photodiode currents Impd over an operation temperature range (e.g., −40, 25, 85° C.) and at desired laser optical power (1 dBm=1.26 mV) of a laser module including the laser diode 201 and the monitor photodiode 202. If the data is completely input to the transmitter unit, a user sets arbitrary desired optical power and an arbitrary desired extinction ratio as variables.

In step 702, the transmitter unit decides if it carries out compensation for a modulation current or compensation for bias current. If compensation for the modulation current is decided according to a result of such a decision, the transmitter unit of the transceiver for optical signal transmission proceeds to step 703.

In step 703, the transmitter unit calculates the modulation currents Imod corresponding to the operation temperature range by using the aforementioned variables. These modulation currents are calculated using an optical power of 1.26 mV and an extinction ratio of 10 dB according to Equations (1) and (2).

Next, in step 704, the transmitter unit seeks Rmod values corresponding to the operation temperature range by means of a relation of Imod vs. Rmod. The Rmod values corresponding to the operation temperature range are previously measured through experiments and are pre-stored in a database. The Rmod values vary with temperature as indicated by the graph shown in FIG. 4a.

In step 705, using the sought Rmod values necessary at each operation temperatures, variation rates of resistance with respect to an operation temperature change ($\Omega/°$ C.) are evaluated in corresponding ranges of the operation temperature change.

Since the variation rates of resistance have positive values in view of general temperature characteristics of the laser diode, in step 706, parallel resistance values are determined by means of a relation between the thermistor and the parallel resistor in the graphs as shown in FIGS. 6a and 6c.

If the parallel resistance values have been determined, a serial resistance value is determined by means of a relation expression of "Rmod−(Rtherm//Rp)." In this way, compensation for the modulation current is automatically achieved in a desired operation temperature range. It is noted that the variation rates of resistance according to the relation between the thermistor and the parallel resistor as shown in FIGS. 6a and 6c are also predicted through experiments and are stored in the database.

In addition, if compensation for the bias current is decided according to a result of the decision in step 702, the transmitter unit of the transceiver proceeds to step 707.

The compensation for the bias current is determined using the monitor photodiode current Impd, and it is possible to compensate for tracking errors of the laser module through such compensation procedures. In theory, the monitor photodiode must generate a constant current irrespective of a temperature change around the laser module at constant optical power. However, if a temperature change around the laser module occurs, the photodiode current actually varies even at constant optical power due to defects in a manufacturing process of the laser module and changes in photodiode characteristics. Since the photodiode current shows a tendency to irregularly vary in each laser module, it is difficult to maintain constant optical power and a constant extinction ratio.

Therefore, to solve this problem, in step 707, the transmitter unit first determines Rbias values at temperature-by-temperature Impd values, based on the photodiode current with respect to specific optical power arbitrarily chosen in the operation temperature range and by means of a relation of Impd vs. Rbias, for example, by using the graph as shown in FIG. 4c. Such Rbias values corresponding to the operation temperature range are also previously measured through experiments and are pre-stored in the database.

In step 708, using the determined Rmod values necessary at each operation temperature, the transmitter unit evaluates variation rates of resistance with respect to an operation temperature change ($\Omega/°$ C.) in corresponding ranges of the operation temperature change. Next, in step 709, temperature-dependent characteristics of thermistor must be determined according to a direction of the variation rates of resistance. However, it is quite probable that the temperature-dependent change in Impd does not show an evident tendency as stated above. Thus, parallel resistance values corresponding to the variation rate are determined by means of the relation between the thermistor and the parallel resistor as shown in FIGS. 6a and 6c in a case where the variation rate has a positive value, and parallel resistance values corresponding to the variation rate are determined by means of the relation between the thermistor and the parallel resistor as shown in FIGS. 6b and 6d in a case where the variation rate has a negative value. It is noted that the variation rates of resistance according to the relation between the thermistor and the parallel resistor as shown in FIGS. 6b and 6d are also predicted through experiments and are stored in the database.

Once the tracking errors are compensated in this way, constant optical power and a constant extinction ratio can be maintained irrespective of a temperature-by-temperature change in Impd. Thereafter, in step 710, the parallel resistance values corresponding to the variation rates of resistance are determined by means of the relation between the thermistor and the parallel resistor and, if the parallel resistance values have been determined, a serial resistance value is determined by means of a relation expression of "Rbias−(Rtherm//Rp)." In this way, compensation for the bias current is achieved in the desired operation temperature range.

Accordingly, an operator and a user can measure trends of change in optical power and an extinction ratio on a temperature-by-temperature basis by using a measuring unit according to the determined Rp1, Rs1, Rp2 and Rs2, and the type of the thermistor.

The algorithm procedures are described as performed in the region taking charge of controls and operations in the transmitter unit of the transceiver, but a designer (operator) and a user may also calculate and determine factors for evaluating the aforementioned resistance values, that is, the modulation current, the bias current and the respective variation rates of resistance. Therefore, in this case, the modulation current and the bias current flowing into the laser diode can be automatically compensated by applying the resistance values, which the designer (operator) and the user have determined, to the LD driver.

As described above, embodiments of the present invention, which is applied to an LD driver, can simultaneously compensate for optical power and tracking errors according to a temperature change of a laser module, so constant optical power and a constant extinction ratio can be obtained with respect to the temperature change.

While the invention has been shown and described with reference to certain embodiments thereof, it will be understood by those skilled in the art that various changes in form and details may be made therein without departing from the spirit and scope of the invention as defined by the appended claims.

What is claimed is:

1. A method for compensating for temperature characteristics of a laser diode used in a transmitter unit of a transceiver for optical signal transmission in an optical communication system, the transceiver including the laser diode and a monitor photodiode, the method comprising the steps of:

deriving a modulation current from an input voltage and variables other than the input votage, evaluating variations of overall modulation resistance values corresponding to an operation temperature range by means of a relation between the modulation current and the overall modulation resistance, and determining the overall modulation resistance values according to the variations of the modulation resistance values; and evaluating variations of overall bias resistance values corresponding to the operation temperature range by means of a current Impd of the photodiode, which is derived at specific optical power chosen in the operation temperature range, and determining the overall bias resistance values according to the variations of the bias resistance values.

2. The method as claimed in claim 1, wherein the step of compensating for the modulation current comprises the sub-steps of:

deriving a modulation current Imod corresponding to the operation temperature range on a temperature-by-temperature basis by using the variables;

seeking overall resistance values Rmod corresponding to the operation temperature range by means of the relation between the modulation current and the overall resistance value;

evaluating variation rates of resistance of whole modulation resistors according to a temperature change in the operation temperature range by using the overall resistance values Rmod necessary at each operation temperature;

determining a parallel resistance value corresponding to a variation rate of resistance according to a relation between a thermistor, a resistance value of which varies with temperature, and a parallel resistor included in the whole modulation resistors by using the evaluated variation rates of resistance;

determining a value of a serial resistor included in the whole modulation resistors by using the parallel resistance value; and applying the determined parallel resistance value and the determined value of the serial resistor to an LD driver to automatically compensate for the modulation current.

3. The method as claimed in claim 2, wherein the variables are a slope efficiency, a threshold current value, an optical power and an extinction ratio.

4. The method as claimed in claim 1, wherein the step of compensating the bias current comprises the sub-steps of:

deriving a monitor photodiode current with respect to specific optical power chosen in the operation temperature range;

determining the overall bias resistance values necessary at each operation temperatures with respect to the monitor photodiode current based on a relation between the monitor photodiode current and the overall bias resistance value;

evaluating variation rates of resistance of whole bias resistors according to a temperature change in the operation temperature range by using the determined overall resistance values necessary at each operation temperature;

determining a parallel resistance value corresponding to a variation rate of resistance according to a relation between a thermistor, a resistance value of which varies with temperature, and a parallel resistor included in the whole bias resistors by using the evaluated variation rates of resistance;

determining a value of a serial resistor included in the whole bias resistors by using the parallel resistance value; and applying the determined parallel resistance value and the determined value of the serial resistor to the LD driver to automatically compensate for the bias current.

5. An apparatus for compensating for temperature characteristics of a laser diode used in a transmitter unit of a transceiver for optical signal transmission in an optical communication system, the transceiver including the laser diode and a monitor photodiode, the apparatus comprising:

a modulation current compensator module configured to derive a modulation current from an input voltage and variables other than the input voltage, to evaluate variations of overall modulation resistance values corresponding to an operation temperature range by means of a relation between the modulation current and the overall modulation resistance, and to determine the overall modulation resistance values according to the variations of the modulation resistance values; and a bias current compensator module configured to evaluate variations of overall bias resistance values corresponding to the operation temperature range by means of a current Impd of the photodiode, which is derived at specific optical power chosen in the operation temperature range, and to determine the overall bias resistance values according to the variations of the bias resistance values.

6. The apparatus as claimed in claim 5, wherein the modulation current compensator module comprises:

a modulation current setting section including a thermistor, a resistance value of which varies with temperature, and parallel and serial resistors connected to the thermistor;

a first current mirror configured to increase a current outputted from the modulation current setting section by factor of an integer; and a variable modulation current source configured to change the modulation current according to the determined values of the parallel and serial resistors.

7. The apparatus as claimed in claim 5, wherein the variables are a slope efficiency, a threshold current value, an optical power, and an extinction ratio.

8. The apparatus as claimed in claim 5, wherein the bias current compensator module comprises:

a bias current setting section including a thermistor, a resistance value of which varies with temperature, and parallel and serial resistors connected to the thermistor;

a second current mirror configured to increase a current outputted from the bias current setting section by factor of an integer; and a variable bias current source configured to change the bias current according to the determined values of the parallel and serial resistors.

9. An optical communication device comprising:

a laser diode; and an LD driver coupled to the laser diode, the LD driver including:

a modulation current compensator module arranged to provide the laser diode with a modulation current derived from an input voltage and variables other than the input voltage, the modulation current compensator module including a modulation current setting section including a first thermistor, a first resistance value of which varies with temperature, and first parallel and first serial resistors connected to the first thermistor, a first current mirror configured to increase a current output from the modulation current setting section by a factor of an integer, and a variable modulation current source configured to change the modulation current according to the determined values of the first parallel and first serial resistors; and a bias current compensator module including a bias current setting section that has a second thermistor, a second resistance value of which varies with temperature, and second parallel and second serial resistors connected to the second thermistor, a second current mirror configured to increase a current output from the bias current setting section by a factor of an integer, and a variable bias current source configured to change the bias current according to the determined values of the second parallel and second serial resistors.

10. The device as claimed in claim 9, wherein the variables are a slope efficiency, a threshold current value, an optical power, and an extinction ratio.

* * * * *